(12) United States Patent
Yamada

(10) Patent No.: US 9,795,029 B2
(45) Date of Patent: Oct. 17, 2017

(54) WIRING THIN PLATE HAVING AERIAL WIRING PORTION AND METHOD OF MANUFACTURING THE SAME

(71) Applicant: NHK SPRING CO., LTD., Yokohama-shi, Kanagawa (JP)

(72) Inventor: Yukie Yamada, Kanagawa (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

(21) Appl. No.: 15/138,040

(22) Filed: Apr. 25, 2016

(65) Prior Publication Data

US 2016/0316555 A1 Oct. 27, 2016

(30) Foreign Application Priority Data

Apr. 24, 2015 (JP) ................. 2015-089790

(51) Int. Cl.
| | | |
|---|---|---|
| G11B 5/48 | (2006.01) | |
| H05K 1/02 | (2006.01) | |
| G11B 5/60 | (2006.01) | |
| H05K 1/05 | (2006.01) | |
| H05K 3/28 | (2006.01) | |

(52) U.S. Cl.
CPC ............ *H05K 1/028* (2013.01); *G11B 5/486* (2013.01); *G11B 5/4853* (2013.01); *G11B 5/60* (2013.01); *H05K 1/056* (2013.01); *H05K 3/28* (2013.01); *H05K 2201/09872* (2013.01); *H05K 2203/0323* (2013.01)

(58) Field of Classification Search
CPC .............................. G11B 5/4853; G11B 5/486
USPC ........................................................ 360/245.9
See application file for complete search history.

(56) References Cited

U.S. PATENT DOCUMENTS

| | | | |
|---|---|---|---|
| 5,428,490 A | 6/1995 | Hagen | |
| 5,434,731 A | 7/1995 | Hagen | |
| 5,504,640 A | 4/1996 | Hagen | |
| 5,602,699 A | 2/1997 | Khan | |
| 5,638,234 A | 6/1997 | Hagen | |
| 5,923,500 A | 7/1999 | Hagen | |
| 6,046,887 A | 4/2000 | Uozumi et al. | |
| 6,134,075 A * | 10/2000 | Bennin | G11B 5/4833 360/240 |

(Continued)

FOREIGN PATENT DOCUMENTS

| | | |
|---|---|---|
| JP | 6-203508 | 7/1994 |
| JP | 9-17139 | 1/1997 |

(Continued)

*Primary Examiner* — Jefferson Evans
(74) *Attorney, Agent, or Firm* — Norris McLaughlin & Marcus, P.A.

(57) ABSTRACT

Provided is a wiring thin plate capable of suppressing deterioration of an electric characteristic and variation in thickness of an aerial wiring portion while advancing reduction of rigidity of the aerial wiring portion. The wiring thin plate includes an aerial wiring portion including wiring traces and passing over an airspace, aerial base layers provided at the respective wiring traces in the aerial wiring portion and being apart from each other, and an aerial cover layer provided in the aerial wiring portion and spanning from the wiring traces of the aerial wiring portion through the aerial base layers to interspaces between adjacent aerial base layers of said aerial base layers.

14 Claims, 8 Drawing Sheets

(56) References Cited

U.S. PATENT DOCUMENTS

| | | | |
|---|---|---|---|
| 6,181,526 B1 * | 1/2001 | Summers | G11B 5/4853 |
| | | | 360/245.9 |
| 6,397,455 B1 | 6/2002 | Hagen | |
| 7,336,446 B2 * | 2/2008 | Kanagawa | G11B 5/486 |
| | | | 360/245.9 |
| 9,330,693 B1 * | 5/2016 | Hahn | G11B 5/486 |
| 2002/0012202 A1 | 1/2002 | Hagen | |
| 2002/0027127 A1 * | 3/2002 | Yagi | G11B 5/4833 |
| | | | 216/57 |
| 2002/0034039 A1 | 3/2002 | Hagen | |
| 2002/0034051 A1 | 3/2002 | Hagen | |
| 2004/0247921 A1 * | 12/2004 | Dodsworth | B32B 15/08 |
| | | | 428/544 |
| 2005/0248885 A1 | 11/2005 | Funada et al. | |
| 2010/0047626 A1 * | 2/2010 | Hitomi | G11B 5/486 |
| | | | 428/810 |
| 2011/0317312 A1 | 12/2011 | Yamaguchi | |
| 2012/0033395 A1 * | 2/2012 | Ishii | H05K 3/0097 |
| | | | 361/784 |
| 2012/0224281 A1 * | 9/2012 | Arai | G11B 5/4833 |
| | | | 360/244.2 |
| 2012/0279757 A1 * | 11/2012 | Ishii | H05K 1/0253 |
| | | | 174/250 |
| 2017/0103777 A1 * | 4/2017 | Hitomi | G11B 5/4833 |

FOREIGN PATENT DOCUMENTS

| | | |
|---|---|---|
| JP | 11-39626 | 2/1999 |
| JP | 2005-322336 | 11/2005 |
| JP | 2012-9111 | 1/2012 |

* cited by examiner

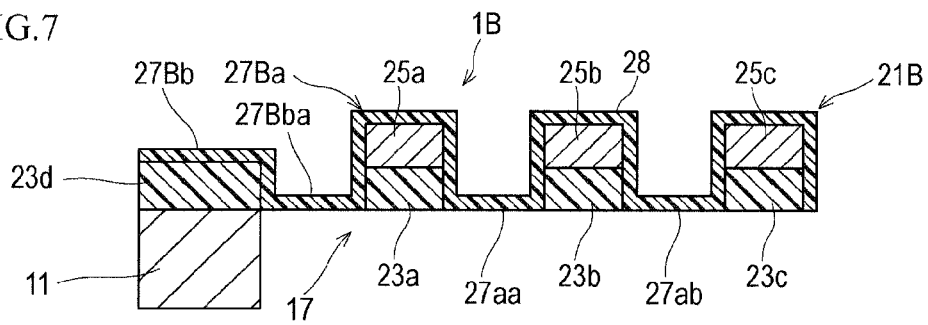
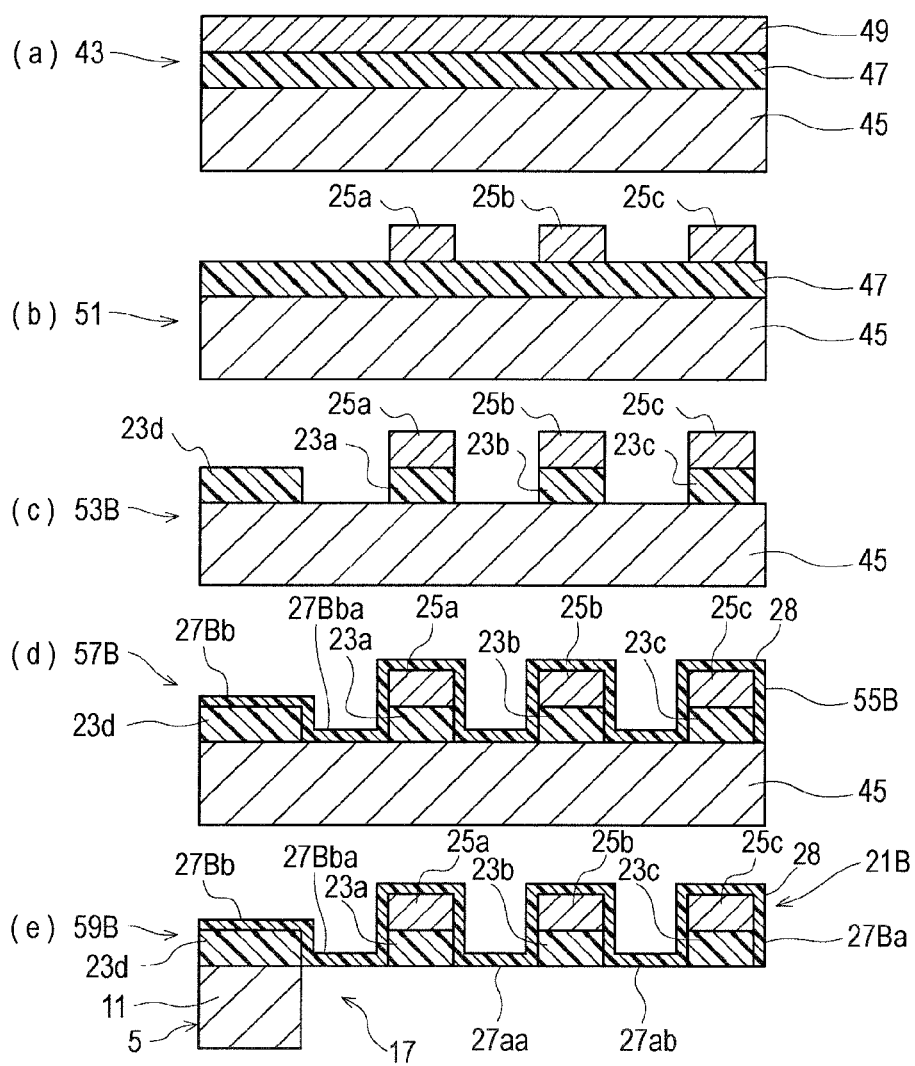

WIRING THIN PLATE HAVING AERIAL WIRING PORTION AND METHOD OF MANUFACTURING THE SAME

BACKGROUND OF THE INVENTION

1. Field of the Invention

The present invention relates to a wiring thin plate applied to a flexure of a head suspension or the like and a method of manufacturing the wiring thin plate.

2. Description of Related Art

A hard disk drive incorporates hard disks that are provided so as to rotate at high speed and head suspensions with sliders that are slightly lifted from the respective hard disks to write/read data to and from the hard disks. Each head suspension has a flexure through which the slider is attached to the head suspension. The flexure includes a wiring part formed on a metal substrate. A front end of the metal substrate is provided with a tongue onto which the slider is attached.

Recent hard disks have high recording density, and therefore, the slider of the head suspension is required to make a flying height lower. In order to stabilize the low flying height, it is important to control rigidity of the metal substrate and wiring part around the tongue of the flexure.

As such a control of rigidity around a tongue of a flexure, JP06-203508A proposes a technique to thin a metal substrate of a flexure, for example.

In the case where the metal substrate is thinned, however, rigidity contribution ratio of a wiring part formed on the metal substrate relatively increases to make it difficult to control the rigidity around the tongue of the flexure.

As other means, JP09-17139A proposes a technique to specially form a planar shape of a metal substrate of a flexure and JP11-39626A proposes a technique to provide a wiring part of a flexure around a tongue with an aerial wiring portion separated from a metal substrate. These related arts, however, hardly reduce the rigidity contribution ratio of the wiring part.

Recently, as a developed technique to reduce rigidity, JP2005-322336A proposes a suspension plate with a circuit and JP2012-9111A proposes a particular flexure.

The suspension plate with the circuit of JP2005-322336A exposes at least a part of a conductive layer from a cover insulating layer at an aerial wiring portion of an outrigger. This, however, has a limit on reduction of rigidity even by partly removing the cover insulating layer because the cover insulating layer has the thickness of about 3 μm in general.

As another improvement of an aerial wiring portion, an aerial wiring portion is formed by gold-plated wiring traces only. This structure, however, tends to cause deformation of the wiring traces and vary the wiring intervals, thereby to deteriorate an electrical characteristic.

The flexure of JP2012-9111A has a thinned base insulating layer at an aerial wiring portion only. This structure, however, uses resin such as polyimide to form the base insulating layer, thins the base insulating layer by etching, and therefore involves a variation of a thickness of the thinned portion among the products.

Such a problem is occurred at not only the outrigger but also another aerial wiring portion of a tail portion of the flexure or of a part other than the flexure.

SUMMARY OF THE INVENTION

An object of the present invention is to provide a wiring thin plate capable of suppressing deterioration of an electric characteristic and variation in thickness of an aerial wiring portion while advancing reduction of rigidity of the aerial wiring portion.

In order to accomplish the object, an aspect of the present invention provides a wiring thin plate, having a supporting layer made of metal, an insulating base layer provided on a top face of the supporting layer, a wiring part having a plurality of wiring traces provided on a top face of the base layer, an insulating cover layer covering the wiring traces, an airspace defined in the supporting layer, an aerial wiring portion that is a part of the wiring part passing over the airspace, aerial base layers provided to the base layer at the respective wiring traces in the aerial wiring portion and being apart from each other, and an aerial cover layer provided to the cover layer in the aerial wiring portion and spanning from the wiring traces of the aerial wiring portion through the aerial base layers to interspaces between adjacent aerial base layers of said aerial base layers.

According to this aspect of the present invention, the wiring traces in the aerial wiring portion involve no base layer between the adjacent wiring traces and are joined together through the aerial cover layer. This structure advances reduction of rigidity in the aerial wiring portion.

Further, the wiring traces of the aerial wiring portion are supported by the respective aerial base layers being apart from each other and the aerial base layers are connected together with the aerial cover layer. This structure prevents deformation of the aerial wiring portion, variation of the wiring intervals, and deterioration of the electrical characteristic.

Furthermore, the aerial base layers are formed locally at the respective wiring traces and no base layer is present between the adjacent wiring traces in the aerial wiring portion. This structure prevents variation in thickness of the wiring thin plate.

BRIEF DESCRIPTION OF THE DRAWINGS

FIG. 5A to C illustrate a method of manufacturing the flexure in which FIG. 5A is a flowchart according to the first embodiment, FIG. 5B is a set of sectional views of steps (a)-(e) according to the first embodiment, and FIG. 5C is a set of sectional views of steps (a)-(e) according to a comparative example;

FIG. 7 is a sectional view partly illustrating one aerial wiring portion of a flexure according to a second embodiment of the present invention;

FIG. 8 is a set of sectional views of steps (a)-(e) of a method of manufacturing the flexure according to the second embodiment;

DETAILED DESCRIPTION OF EMBODIMENTS

Figure 1:
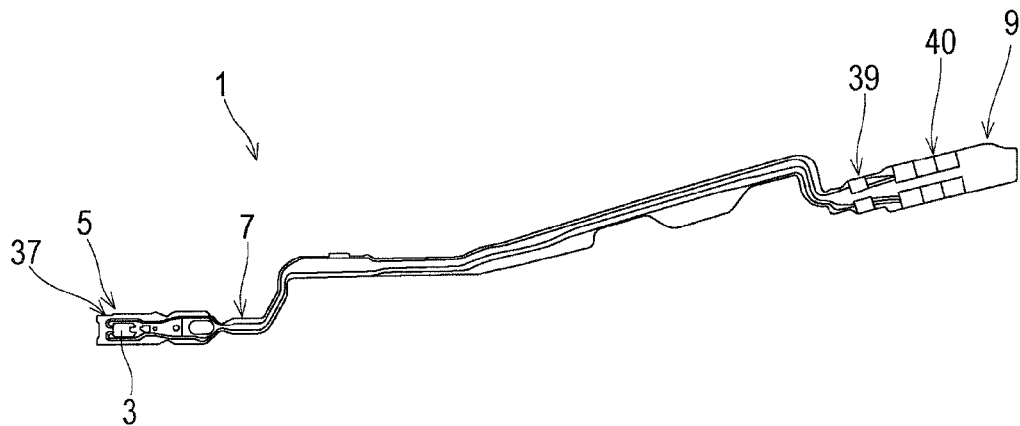
FIG. 1 is a plan view schematically illustrating a flexure according to a first embodiment of the present invention.

Wiring thin plates according to embodiments of the present invention will be explained in detail. Each embodiment embodies one of first to third wiring thin plates to suppress deterioration of an electric characteristic and variation in thickness of an aerial wiring portion while advancing reduction of rigidity of the aerial wiring portion.

The first wiring thin plate has a supporting layer made of metal, an insulating base layer provided on a top face of the supporting layer, a wiring part having a plurality of wiring traces provided on a top face of the base layer, an insulating cover layer covering the wiring traces, an airspace defined in the supporting layer, an aerial wiring portion that is a part of the wiring part passing over the airspace, aerial base layers provided to the base layer at the respective wiring traces in the aerial wiring portion and being apart from each other, and an aerial cover layer provided to the cover layer in the aerial wiring portion and spanning from the wiring traces of the aerial wiring portion through the aerial base layers to interspaces between adjacent aerial base layers of said aerial base layers.

The second wiring thin plate has a supporting layer made of metal, an insulating base layer provided on a top face of the supporting layer, a wiring part having a plurality of wiring traces provided on a top face of the base layer, an insulating cover layer covering the wiring traces, an airspace defined in the supporting layer, an aerial wiring portion that is a part of the wiring part passing over the airspace, aerial base layers provided to the base layer at the respective wiring traces in the aerial wiring portion and being apart from each other, an aerial cover layer provided to the cover layer in the aerial wiring portion and spanning from the wiring traces of the aerial wiring portion through the aerial base layers to interspaces between adjacent aerial base layers of said aerial base layers, openings formed through the aerial cover layer to open respective top faces of the wiring traces of the aerial wiring portion, thereby to form top-face-exposed portions on the respective wiring traces of the aerial wiring portion, and plated layers covering the respective wiring traces in the top-face-exposed portions.

The third wiring thin plate has a supporting layer made of metal, an insulating base layer provided on a top face of the supporting layer, a wiring part having a plurality of wiring traces provided on a top face of the base layer, an insulating cover layer covering the wiring traces, an airspace defined in the supporting layer, an aerial wiring portion that is a part of the wiring part passing over the airspace, an extended airspace defined in the base layer in the aerial wiring portion to open back faces of the wiring traces in the aerial wiring portion, thereby to form on the respective wiring traces of the aerial wiring portion back-face-exposed portions facing the airspace, an aerial cover layer provided to the cover layer in the aerial wiring portion and spanning from the wiring traces of the aerial wiring portion to interspaces between adjacent wiring traces of said wiring traces of the aerial wiring portion, and plated layers covering the respective wiring traces in the back-face-exposed portions.

Each one aerial base layer of said aerial base layers may have the same width as a corresponding wiring trace formed on said each one aerial base layer.

The aerial cover layer may join the adjacent aerial base layers together.

The aerial cover layer may join the adjacent wiring traces of the aerial wiring portion together.

A link may be provided to the aerial cover layer so that the link extends to the supporting layer in a direction along which the wiring traces are arranged side by side.

The wiring thin plate may be applied to a flexure of a head suspension in which outriggers are provided to the supporting layer and a tongue is supported with the outriggers and on which a slider is attached. The airspace may be defined on one of first and second sides of each one outrigger of said outriggers, the first side being proximal to the tongue and the second side being distal to the tongue.

A method of manufacturing the first wiring thin plate has steps of laminating a metal layer for the supporting layer, a first insulating layer for the base layer, and a conductive layer for the wiring part in this order to form a base material, partly removing the conductive layer of the base material to shape the wiring part and form a first intermediate material, partly removing the first insulating layer of the first intermediate material to shape the base layer with the aerial base layers and form a second intermediate material, covering the wiring part and the aerial base layers of the second intermediate material with a second insulating layer for the aerial cover layer to form a third intermediate material, and partly removing the metal layer of the third intermediate material to shape the supporting layer with the airspace and finish the wiring thin plate.

A method of manufacturing the second wiring thin plate has steps of laminating a metal layer for the supporting layer, a first insulating layer for the base layer, and a conductive layer for the wiring part in this order to form a base material, partly removing the conductive layer of the base material to shape the wiring part and form a first intermediate material, partly removing the first insulating layer of the first intermediate material to shape the base layer with the aerial base layers and form a second intermediate material, covering the wiring part and the aerial base layers of the second intermediate material with a second insulating layer for the aerial cover layer and forming the openings to shape the top-face-exposed portions and form a third intermediate material, and partly removing the metal layer of the third intermediate material to shape the supporting layer with the airspace and forming the plated layers on the top-face-exposed portions to cover the respective wiring traces and finish the wiring thin plate.

A method of manufacturing the third wiring thin plate has steps of laminating a metal layer for the supporting layer, a first insulating layer for the base layer, and a conductive layer for the wiring part in this order to form a base material, partly removing the conductive layer of the base material to shape the wiring part and form a first intermediate material, partly removing the metal layer of the first intermediate material to shape the supporting layer with the airspace and form a second intermediate material, covering the wiring part of the second intermediate material with a second insulating layer for the aerial cover layer and partly removing the first insulating layer of the second intermediate material to shape the base layer, the extended airspace and the back-face-exposed portions and form a third intermediate material, and forming the plated layers on the respective back-face-exposed portions to cover the respective wiring traces and finish the wiring thin plate.

Hereinafter, a general configuration of a flexure according to the first embodiment of the present invention will be explained with reference to FIGS. 1 to 2B.

Figure 2A:
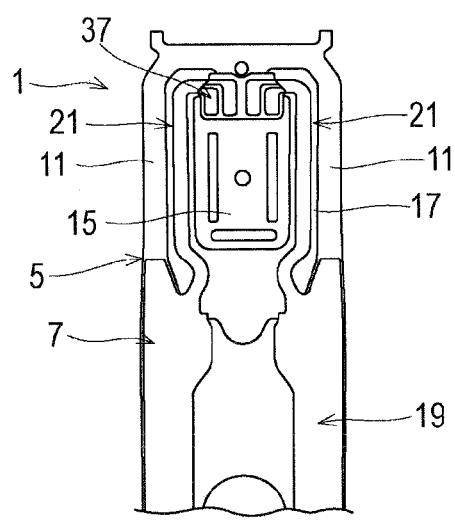
FIG. 2A is a plan view illustrating aerial wiring portions and their periphery of the flexure of FIG. 1
Figure 2B:
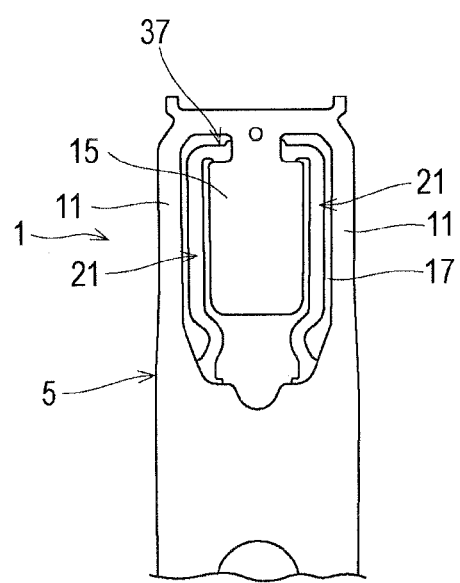
FIG. 2B is a back view illustrating the same.

FIG. 1 is a plan view schematically illustrating a flexure according to the first embodiment of the present invention, FIG. 2A is a plan view illustrating aerial wiring portions and their periphery of the flexure of FIG. 1 and FIG. 2B is a back view illustrating the same. In the following explanation, "right" and "left" mean both sides in a lateral direction orthogonal to a longitudinal direction of the flexure, "up" and "down" mean both sides in a thickness direction of the flexure, and "front" and "rear" mean a tongue side and a tail side of the flexure in the longitudinal direction, respectively.

The flexure 1 illustrated in FIG. 1 is an example of the wiring thin pate that is attached to a load beam of a head suspension installed in, for example, a hard disk drive for a computer. A front end of the flexure 1 supports a slider 3 that is used to write and read data to and from a hard disk etc. As other examples of the wiring thin plate, there are circuit boards of electric parts other than the flexure 1.

As illustrated in FIGS. 1 to 2B, the flexure 1 has a metal substrate 5 and a wiring part 7. The metal substrate 5 is an example of the supporting layer made of metal. According to the embodiment, the metal substrate 5 is a resilient precision metal thin plate or foil made of, for example, stainless steel having a thickness in the range of, for example, about 18 to 30 µm.

The metal substrate 5 extends along the load beam of the head suspension and is fixed thereto by, for example, laser welding. A base end of the metal substrate 5 is the tail portion 9 and a front end of the substrate 5 is a head portion that has a pair of outriggers 11 to support a tongue 15.

The outriggers 11 are arranged on both lateral sides or right and left sides of the front end of the metal substrate 5, respectively. The outriggers 11 extend in a front-rear direction of the flexure 1 and front ends of the outriggers 11 support the tongue 15 in a cantilever manner.

Figure 5:
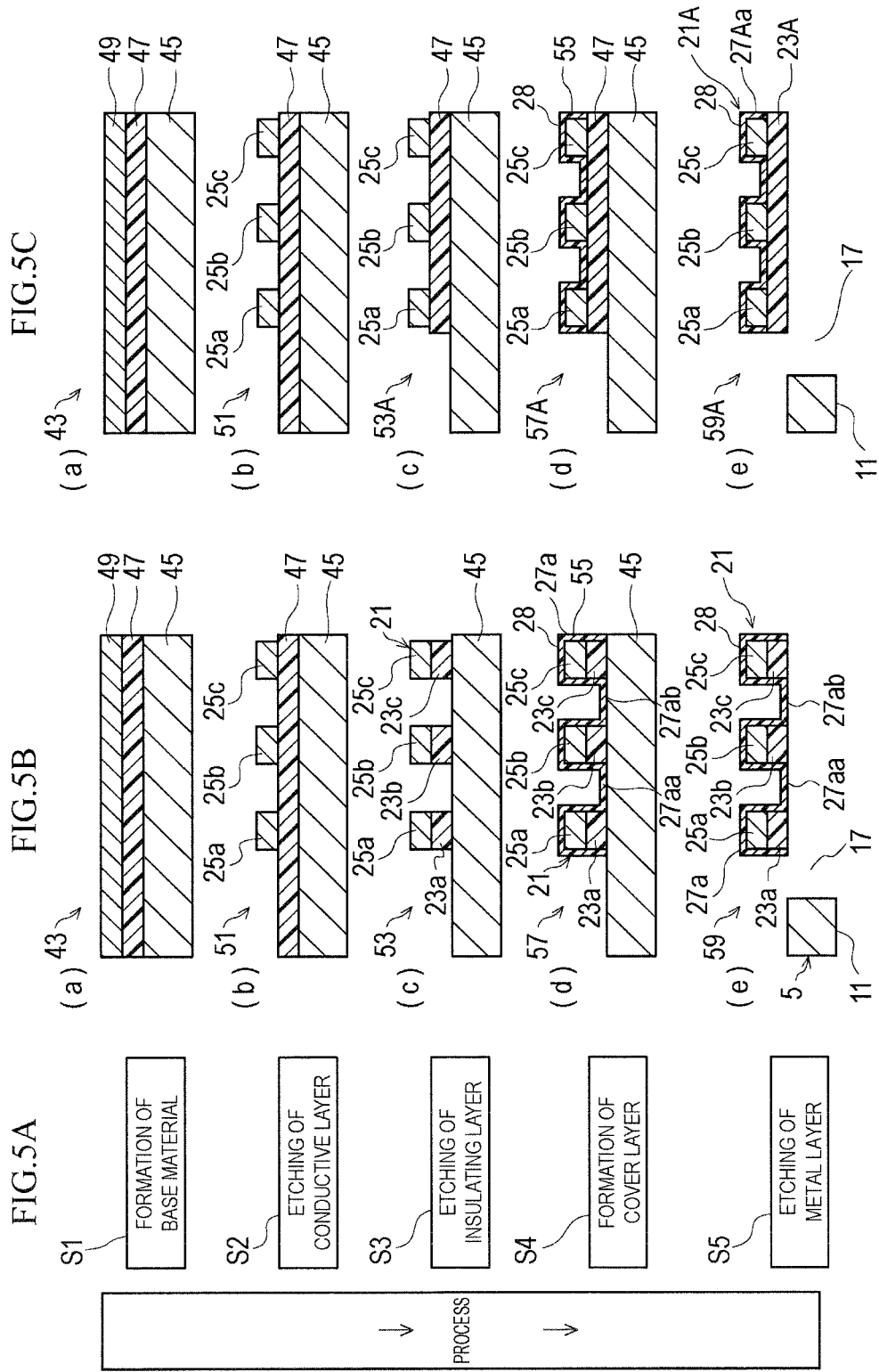

The tongue 15 has a free end that extends toward the rear of the metal substrate 5. The tongue 15 is entirely arranged between the outriggers 11. In each one of right and left interspaces between the tongue 15 and the outriggers 11, there is formed an airspace 17 that is a space being shifted out of a body of the metal substrate 5. The airspace 17 is formed by partly removing a metal layer 45 to shape the metal substrate 5 as explained later (FIG. 5B). Thus, the airspace 17 is defined in a layer to which the metal substrate 5 belongs i.e. in the supporting layer. The tongue 15 is arranged parallel to the outriggers 11 with the airspaces 17. The airspace 17 is extended into a space between the free end of the tongue 15 and an edge of the metal substrate 5 opposing to the free end of the tongue 15 in the front-rear direction.

A back face of the tongue 15 is pivotally supported with a dimple (not illustrated) formed at a front end of the load beam. Onto a top face of the tongue 15, a slider 3 is attached. The slider 3 is connected to the wiring part 7 to transmit write and read signals.

The wiring part 7 extends from a fixed end of the tongue 15 to the tail portion 9 while passing over the airspaces 17 between the tongue 15 and the outriggers 11. The wiring part 7, therefore, includes a normal wiring portion 19 that is arranged on the body of the metal substrate 5 and aerial wiring portions 21 that pass over the respective airspaces 17. Namely, a part of the wiring part 7 passes over the airspaces 17 to compose the aerial wiring portions 21.

Figure 3:
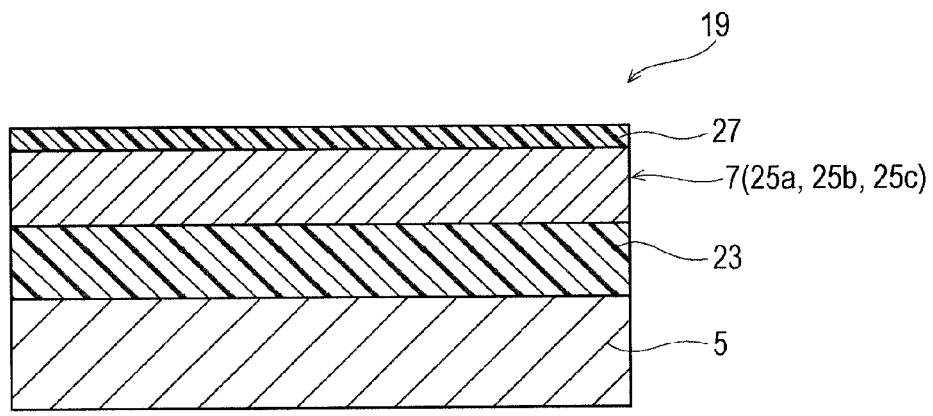
FIG. 3 is a sectional view partly illustrating a normal wiring portion of the flexure of FIG. 1 on a plane along the normal wiring portion.
Figure 4:
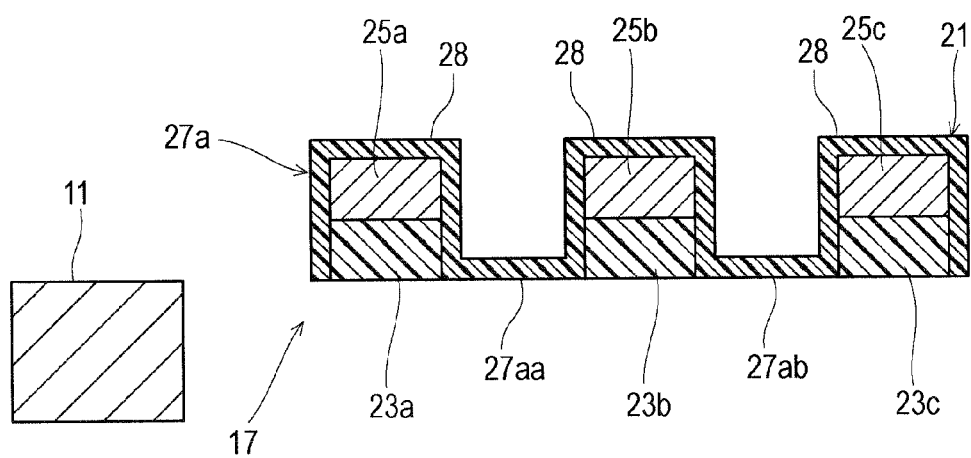
FIG. 4 is a sectional view partly illustrating one aerial wiring portion of FIG. 2A on a plane orthogonal to the one aerial wiring portion.

The wiring part 7 will be explained in detail with reference to FIGS. 3 and 4 in which FIG. 3 is a sectional view partly illustrating the normal wiring portion 19 of the flexure 1 on a plane along the normal wiring portion 19 and FIG. 4 is a sectional view partly illustrating one aerial wiring portion 21 on a plane orthogonal to the one aerial wiring portion 21. In FIG. 4, the one aerial wiring portion is the left aerial wiring portion 21. The right and left aerial wiring portions 21 are symmetric and therefore only the left aerial wiring portion 21 will be explained.

As illustrated in FIG. 3, the normal wiring portion 19 in the sectional structure has a base layer 23, wiring traces 25a, 25b, and 25c (FIG. 4), and a cover layer 27.

The base layer 23 is made of insulating resin such as polyimide. The base layer 23 is a thin plate layered on the metal substrate 5, and in particular is provided on a top face of the metal substrate 5. The base layer 23 secures electrical insulation for the wiring traces 25a, 25b, and 25c. The base layer 23 extends along the back faces (lower faces in FIG. 3) of the wiring traces 25a, 25b, and 25c in a routing direction of the wiring traces. In the cross section on a plane orthogonal to the routing direction, the base layer 23 is formed into a flat shape so as to span the wiring traces 25a, 25b, and 25c in the right and left direction. The base layer 23 has a thickness in a range of, for example, about 10 to 20 µm. This thickness, however, may be adjusted depending on a required dielectric strength voltage.

Each one of the wiring traces 25a, 25b, and 25c is made of, for example, highly conductive metal such as copper. The wiring traces 25a, 25b, and 25c are thin plates layered on the base layer 23, and in particular are provided on a top face of the base layer 23. The wiring traces 25a, 25b, and 25c have a thickness in a range of, for example, about 3 to 18 µm.

The cover layer 27 is a thin plate that covers the wiring part 7 and is made of insulating resin such as polyimide. In particular, the cover layer 27 coats the wiring traces 25a, 25b, and 25c of the wiring part 7 so as to have a thickness less than the base layer 23. The thickness of the cover layer 27 is set in a range of, for example, about 1 to 5 µm.

As illustrated in FIG. 4, the airspace 17 is on an inner side of the outrigger 11 in the right and left direction and is adjoining to the outrigger 11 around the aerial wiring portion 21. The inner side of the outrigger 11 is the first side of the outrigger 11 being proximal to the tongue 15 in the right and left direction.

Each one of the wiring traces 25a, 25b, and 25c has a rectangular cross section and is continuous from the normal wiring portion 19 to the aerial wiring portion 21. The wiring traces 25a, 25b, and 25c are arranged apart from each other with a gap between adjacent ones of the wiring traces in the right and left direction.

In the aerial wiring portion 21, the base layer 23 is provided with aerial base layers 23a, 23b, and 23c. The aerial base layers 23a, 23b, and 23c are thin plates provided at the respective wiring traces 25a, 25b, and 25c and are apart from each other in the right and left direction. The aerial base layers 23a, 23b, and 23c are overlaid with and extend along the respective wiring traces 25a, 25b, and 25c so that the aerial base layers 23a, 23b, and 23c have the same widths in the right and left direction as the respective wiring traces 25a, 25b, and 25c. Namely, each one aerial base layer of the aerial base layers 23a, 23b, and 23c has the same width as the corresponding wiring trace formed on said each one aerial base layer. The aerial base layers 23*a*, 23*b*, and 23*c* do not necessarily have the same widths as the respective wiring traces 25*a*, 25*b*, and 25*c*. For example, each one aerial base layer may be wider or narrower than the corresponding wiring trace.

The cover layer 27 is provided with the aerial cover layer 27*a* in the aerial wiring portion 21. According to the embodiment, the aerial cover layer 27*a* is a thin plate having a different shape from the cover layer 27 in the normal wiring portion 19 and has cap portions 28 and connecting portions 27*aa* and 27*ab*.

The cap portions 28 are provided to the respective wiring traces 25*a*, 25*b*, and 25*c*. Each one cap portion 28 is formed by a thin plate so as to trace and coat a top face and right and left side faces of the corresponding one of the wiring traces 25*a*, 25*b*, and 25*c*. Further, lower ends of the cap portions 28 are extended toward the respective aerial base layers 23*a*, 23*b*, and 23*c* so that each cap portion 28 traces and coats right and left side faces of the corresponding one of the aerial base layers 23*a*, 23*b*, and 23*c*. The adjacent cap portions 28 are integrally connected together at the lower ends through the connecting portion 27*aa* or 27*ab*. With this, the connecting portion 27*aa* fills the first interspace between the aerial base layers 23*a* and 23*b* to connect them together and the connecting portion 27*ab* fills the second interspace between the aerial base layers 23*b* and 23*c* to connect them together.

The connecting portions 27*aa* and 27*ab* are thin plates on the same level with each other and straightly run in the right and left direction in the cross section. However, the connecting portions may be inclined relative to the right and left direction. Back faces of the aerial base layers 23*a*, 23*b*, and 23*c* and the aerial cover layer 27*a* are flash with each other and face the airspace 17. Each one of the connecting portions 27*aa* and 27*ab*, therefore, faces the airspace 17 and connects the adjacent ones of the aerial base layers 23*a*, 23*b*, and 23*c*.

The connecting portions 27*aa* and 27*ab* has a thickness that is the same as the cap portions 28. The thickness of the connecting portions 27*aa* and 27*ab*, however, may be thicker or thinner than the cap portions 28.

The positions of the connection portions 27*aa* and 27*ab* are not limited to the aforementioned positions at which the back faces of the aerial base layers 23*a*, 23*b*, and 23*c* and the aerial cover layer 27*a* are flash with each other. The connecting portions 27*aa* and 27*ab* may be optionally positioned in the up and down direction within the right and left side faces of the wiring traces 25*a*, 25*b*, and 25*c* and the aerial base layers 23*a*, 23*b*, and 23*c*. For example, the connecting portions 27*aa* and 27*ab* may be positioned so that the top faces of the connecting portions 27*aa* and 27*ab* flash with the top faces of the cap portions 28. Alternatively, the connecting portions 27*aa* and 27*ab* may be positioned at different levels in the up and down direction to control the rigidity of the aerial wiring portion 21.

The wiring part 7 having the aforementioned configuration is further provided with the terminals 37 and 39 at both ends as illustrated in FIG. 1 and is connected to terminals (not illustrated) of the slider 3 and external wiring (not illustrated) through the terminals 37 and 39.

The terminal 37 at the one end is arranged on the fixed end side of the tongue 15 and the terminal 39 at the other end is arranged on a front end side of the tail portion 9. On the rear end side of the tail portion 9, terminals 40 are provided for an electrical characteristic test conducted after attaching the slider 3. The terminals 40 have the same or substantially the same sectional structure as the terminals 37 and 39.

FIG. 5A to C illustrate a method of manufacturing the flexure 1 in which FIG. 5A is a flowchart according to the first embodiment, FIG. 5B is a set of sectional views of steps according to the first embodiment, and FIG. 5C is a set of sectional views of steps according to a comparative example.

A method of manufacturing the flexure 1 according to the embodiment will be explained with reference to FIGS. 5A and 5B. As illustrated in FIG. 5A, the process steps according to the embodiment include the first step S1 (formation of a base material), the second step S2 (etching of a conductive layer), the third step S3 (etching of an insulating layer), the fourth step S4 (formation of a cover layer) and the fifth step S5 (etching of a metal layer).

The first step S1 (formation of a base material) forms a base material 43 as illustrated in the step (a) of FIG. 5B. The base material 43 is a laminate in which a metal layer 45, a first insulating layer 47 and a conductive layer 49 are laminated one on another in this order. The metal layer 45 is a plate made of stainless steel and is for forming the metal substrate 5 as the supporting layer. The first insulating layer 47 is a thin plate made of polyimide and is for forming the base layer 23. The conductive layer 49 is a thin plate made of copper and is for forming the wiring part 7.

The second step S2 (etching of a conductive layer) partly removes the conductive layer 49 of the base material 43 to shape the wiring part 7 and thereby form a first intermediate material 51. The partly-removing of the conductive layer 49 is performed by, for example, etching of copper. In the first intermediate material 51, the normal wiring portion 19 and the aerial wiring portion 21 have the wiring traces 25*a*, 25*b*, and 25*c* as illustrated in the step (b) of FIG. 5B.

The third step S3 (etching of an insulating layer) partly removes the first insulating layer 47 of the first intermediate material 51 to shape the base layer 23 (FIG. 3) with the aerial base layers 23*a*, 23*b*, and 23*c* and thereby form a second intermediate material 53. The partly-removing of the first insulating layer 47 is performed by, for example, etching of polyimide. In particular, in the unfinished aerial wiring portion 21 of the second intermediate material 53, the removed or etched portions of the first insulating layer 47 are positioned on right and left sides of each one of the wiring traces 25*a*, 25*b*, and 25*c* so that the aerial base layers 23*a*, 23*b*, and 23*c* are formed to the respective wiring traces 25*a*, 25*b*, and 25*c* as illustrated in the step (c) of FIG. 5B.

The aerial base layers 23*a*, 23*b*, and 23*c* of the second intermediate material 53 in the step (c) of FIG. 5B are of the aerial wiring portion 21. In the normal wiring portion 19, the flat base layer 23 remains on the metal substrate 5 with absence of the removed or etched portions and the wiring traces 25*a*, 25*b*, and 25*c* are arranged on the flat base layer 23. The normal wiring portion 19 may have the same structure as the aerial wiring portion 21.

The fourth step S4 (formation of a cover layer) covers the second intermediate material 53 with a second insulating layer 55 to form a third intermediate material 57. The second insulating layer 55 forms the cover layer 27 of the normal wiring portion 19 (FIG. 3) and the aerial cover layer 27*a* as illustrated in the step (d) of FIG. 5B. The cover layer 27*a* covers the wiring traces 25*a*, 25*b*, and 25*c* and the aerial base layers 23*a*, 23*b*, and 23*c* in the unfinished aerial wiring portion 21 of the second intermediate material 53.

The aerial cover layer 27*a* includes the cap portions 28 and the connecting portions 27*aa* and 27*ab*. The cap portions 28 and the connecting portions 27aa and 27ab are simultaneously formed to have the same thickness.

The position and the thickness of each one of the connecting portions 27aa and 27ab is adjusted by entirely filling with the material of the second insulating layer 55 the interspace between the adjacent ones of the aerial base layers 23a, 23b, and 23c and etching the filled material in the interspace. The adjustment of the positions and the thicknesses of the connecting portions 27aa and 27ab may be conducted by the other technique.

The fifth step S5 (etching of a metal layer) partly removes the metal layer 45 of the third intermediate material 57 to shape the metal substrate 5 as the supporting layer with the airspace 17 and thereby obtain the product 59 i.e. finish the flexure 1 as illustrated in the step (e) of FIG. 5B. The partly-removing of the metal layer 45 is performed by, for example, etching of stainless steel. With this etching, the airspace 17 is formed to shape the outrigger 11 and the aerial wiring portion 21 on each side of the flexure 1 in the right and left direction.

A method according to the comparative example (hereinafter, referred to as the "comparative method") will be explained with reference to FIG. 5C. The comparative method is to form a product 59A that has a flat aerial base layer 23A in an aerial wiring portion 21A like a normal wiring portion. In the comparative method, the first step S1 and the second step S2 are performed to sequentially form a base material 43 and a first intermediate material 51 in the same way as the method according to the embodiment in the steps (a) and (b) of FIG. 5C.

The steps (c), (d) and (e) of the comparative method, however, are different from the third step S3 of the step (c) to form the second intermediate material 53, the fourth step S4 of the step (d) to form the third intermediate material 57, and the fifth step S5 of the step (e) to form the product 59 according to the embodiment.

The steps of the comparative method illustrated in the steps (c) and (d) of FIG. 5C simply removes a portion of a first insulating layer 47 over an outrigger 11 so that the remaining portion of the first insulating layer 47 becomes a flat plate spanning the back faces of the wiring traces 25a, 25b, and 25c in the right and left direction. In this state, an aerial cover layer 27Aa is formed on the wiring traces 25a, 25b, and 25c. Then, the step illustrated in the step (e) of FIG. 5C partly removes a metal layer 45 to shape an airspace 17. Over the airspace 17, a base layer 23A of an aerial wiring portion 21A continuously spans the back faces of the wiring traces 25a, 25b, 25c in the right and left direction.

Comparing FIGS. 5B and 5C, therefore, the aerial base layers 23a, 23b, and 23c and the aerial cover layer 27a in FIG. 5B are significantly different from the base layer 23A and the aerial cover layer 27Aa in FIG. 5C, respectively.

The method according to the embodiment forms the aerial wiring portions 21 together with the terminals 37 and 39 of the flexure 1.

Figure 6:
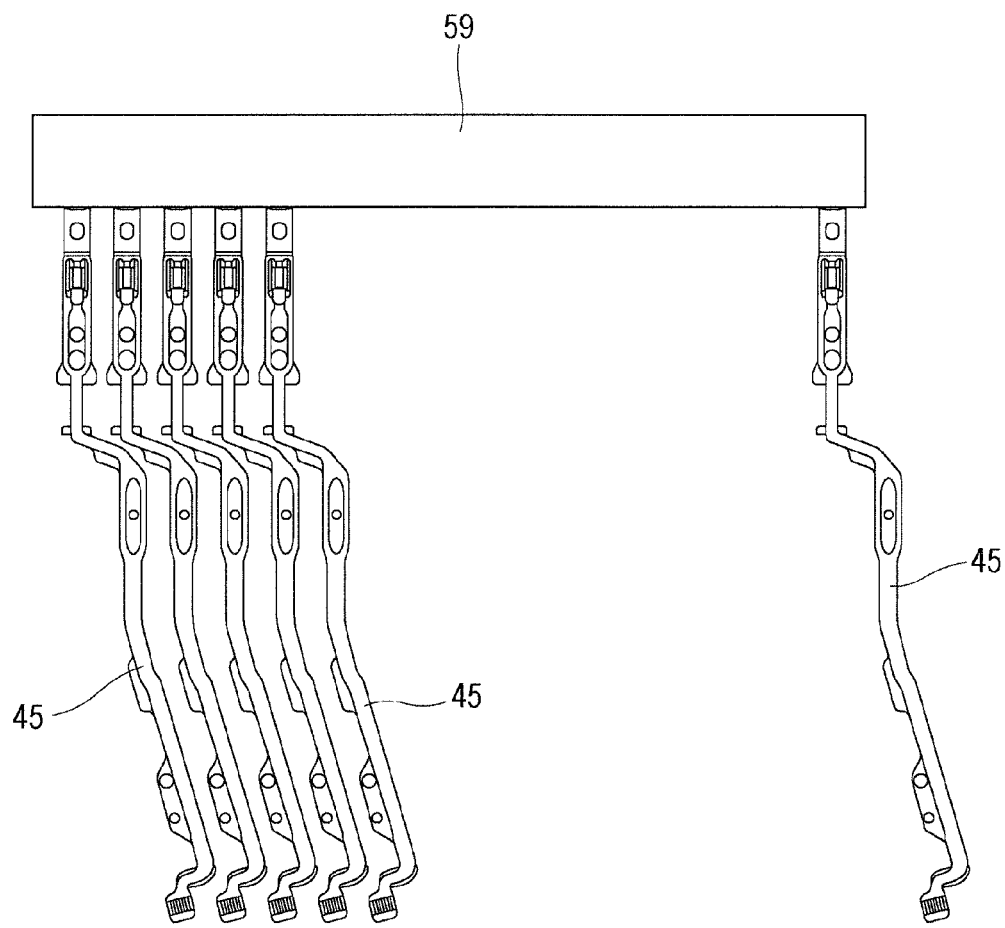
FIG. 6 is a plan view schematically illustrating a frame structure for chained metal layers applied to the method according to the first embodiment.

Further, the method according to the embodiment may use a panel 59 as a frame in which a plurality of metal layers 45 are chained, each one metal layer 45 corresponding to a metal substrate 5 of a flexure 1 as illustrated in FIG. 6. The each one metal layer 45 of the panel 59 is formed in advance into a given shape by etching etc. In FIG. 6, the metal layers 45 are omitted in the middle of the chaining direction.

To the metal layers 45 of the panel 59, the method according to the embodiment is simultaneously applied to finish a plurality of flexures 1 (FIG. 1).

A rigidity contribution rate of the aerial wiring portion 21 will be explained.

As is apparent from the comparison between the products 59 and 59A of FIGS. 5B and 5C, the product 59A of the comparative example has the base layer 23A flatly spanning the back faces of the writing traces 25a, 25b, and 25c in both the right and left direction and the front-rear direction. In contrast, the product 59 of the embodiment has the discrete aerial base layers 23a, 23b, and 23c formed to the respective wiring traces 25a, 25b, and 25c. With this configuration, the product 59 of the embodiment apparently has the lower rigidity than the product 59A of the comparative example.

Here, the rigidity contribution rate means a percentage of the rigidity of the aerial wiring portion 21 in the total rigidity of the metal substrate 5 and the aerial wiring portion 21 around the tongue 15.

Observing the rigidity contribution rates of the aerial wiring portion 21 in a roll direction and a pitch direction relative to a center line of the flexure 1, the aerial wiring portion 21 according to the embodiment greatly reduces both roll rigidity and pitch rigidity in comparison with the comparative example and thereby greatly reduces a roll rigidity contribution rate and a pitch rigidity contribution rate in comparison with the comparative example.

Electric characteristic of the aerial wiring portion 21 will be explained.

As is apparent from the comparison between the products 59 and 59A of FIGS. 5B and 5C, the product 59 of the embodiment supports the wiring traces 25a, 25b, and 25c with the aerial base layers 23a, 23b, and 23c mainly in the pitch direction. In the roll direction, the product 59 maintains an appropriate rigidity of the wiring traces 25a, 25b, and 25c to prevent deformation of the wiring traces in comparison with the product 59A.

The interspace between the adjacent ones of the wiring traces 25a, 25b, and 25c has a distance kept by the corresponding one of the connecting portions 27aa and 27ab of the aerial cover layer 27a so as to prevent variation of the wiring intervals and obtain an appropriate roll rigidity.

Even the aerial wiring portion 21 having the lower rigidity of the wiring part 7 appropriately supports the wiring traces 25a, 25b, and 25c to prevent deterioration of electric characteristic of the aerial wiring portion 21.

As mentioned above, the flexure 1 as the wiring thin plate according to the first embodiment has the metal substrate 5, the insulating base layer 23 provided on the top face of the metal substrate 5, the wiring part 7 having the plurality of wiring traces 25a, 25b, and 25c provided on the top face of the base layer 23, and the insulating cover layer 27 covering the wiring part 7. The flexure 1 further has the airspace 17 defined in the metal substrate 5, the aerial wiring portion 21 that is a part of the wiring part 7 passing over the airspace 17, the aerial base layers 23a, 23b, and 23c provided to the base layer 23 at the respective wiring traces 25a, 25b, and 25c in the aerial wiring portion 1 and being apart from each other, and the aerial cover layer 27a provided to the cover layer 27 in the aerial wiring portion 21 and spanning from the wiring traces 25a, 25b, and 25c of the aerial wiring portion 21 through the aerial base layers 23a, 23b, and 23c to the sinterspaces between adjacent aerial base layers of the aerial base layers 23a, 23b, and 23c.

The aerial wiring portion 21, therefore, surely reduces the rigidity contribution rate. In the hard disk drive, hard disks rotate at high speed and sliders 3 are supported with head suspensions and are slightly lifted from the respective hard disks to write/read data to and from the hard disks. Each head suspension has a low flying height of the slider 3 to be adapted to high recording density of the hard disk. In order to realize and stabilize such a low flying height, it is important to control rigidity of the metal substrate 5 and the wiring part 7 around the tongue 15 of the flexure 1.

For such a control of rigidity around the tongue 15, the embodiment reduces the rigidity contribution rate of the aerial wiring portion 21 relative to the comparative example as mentioned above. This allows the rigidity to be easily controlled around the tongue 15.

Further, the interspaces in the wiring traces 25*a*, 25*b*, and 25*c* have the distances kept by the connecting portion 27*aa* spanning between the aerial base layers 23*a* and 23*b* and by the connecting portion 27*ab* spanning between the aerial base layers 23*b* and 23*c*. This configuration prevents the variation of the wiring intervals and obtains the appropriate rigidity, thereby to prevent the deterioration of the electric characteristic.

In the case where each one aerial base layer of the aerial base layers 23*a*, 23*b*, and 23*c* has the same width as the corresponding wiring trace formed on the each one aerial base layer, the wiring traces 25*a*, 25*b*, and 25*c* are surely connected together through the aerial cover layer 27*a*, thereby to surely control the rigidity and prevent the deterioration of the electric characteristic.

The aerial cover layer 27*a* covers the both side faces of the aerial base layers 23*a*, 23*b*, and 23*c*, the both side faces and the top faces of the wiring traces 25*a*, 25*b*, and 25*c* and joins the adjacent aerial base layers together in each interspace between the adjacent aerial base layers of the aerial base layers 23*a*, 23*b*, and 23*c*.

This structure surely controls the rigidity while securing electric insulation and surely prevents the deterioration of the electric characteristic.

The second embodiment of the present invention will be explained with reference to FIGS. 7 and 8 in which FIG. 7 is a sectional view partly illustrating one aerial wiring portion and FIG. 8 is a set of sectional views of steps (a)-(e) of a method of manufacturing the flexure. The second embodiment is basically the same as the first embodiment, and therefore, parts corresponding to those of the first embodiment are represented with the same reference numerals as the first embodiment, or the same reference numerals plus "B" to omit repetition of explanation.

As illustrated in FIG. 7, the aerial wiring portion 21B according to the second embodiment has a link 27Bb provided to the aerial cover layer 27Ba. The link 27Bb is integrated with the aerial cover layer 27Ba and extends to the outrigger 11 of the metal substrate 5 as a supporting layer in a direction along which the wiring traces 25*a*, 25*b*, and 25*c* are arranged side by side. In FIG. 7, only the left outrigger 11 and the left aerial wiring portion 21B are indicated. The right outrigger 11 and the right aerial wiring portion 21B are omitted. The right and left outriggers and aerial wiring portions are symmetric.

According to the embodiment, the outrigger 11 has an outrigger base layer 23*d* that is formed together with the aerial base layers 23*a*, 23*b*, and 23*c*. From an inner side face of the outrigger base layer 23*d* to a top face of the same, the link 27Bb is formed so as to trace and coat the top face and the inner side face of the outrigger base layer 23*d*. The inner side face of the outrigger base layer 23*d* faces toward the aerial base layers 23*a*, 23*b*, and 23*c*. The link 27Bb has an integrated connecting portion 27Bba through which the link 27Bb is integrally connected to the aerial cover layer 27Ba between the link 27Bb and the aerial base layer 23*a* in the right and left direction. The connecting portion 27Bba has a back face that is flash with back faces of the aerial base layers 23*a*, 23*b*, and 23*c* and connecting portions 27*aa* and 27*ab*.

The link 27Bb and the connecting portion 27Bba longitudinally extends along the outrigger 11. In view of low rigidity, the outrigger base layer 23*d*, the link 27Bb and the connecting portion 27Bba may be longitudinally partly formed relative to the outrigger 11.

In the case where the outrigger base layer 23*d*, the link 27Bb and the connecting portion 27Bba are partly formed, a set of the outrigger base layer 23*d*, the link 27Bb and the connecting portion 27Bba may be arranged at a single portion or a plurality of portions at intervals. Further, the outrigger base layer 23*d* and the link 27Bb may be partly formed and the connecting portion 27Bba may be longitudinally continuously formed along the outrigger 11. Alternatively, the connecting portion 27Bba may be partly formed and the outrigger base layer 23*d* and the link 27Bb may be longitudinally continuously formed along the outrigger 11.

As illustrated in FIG. 8, the method of manufacturing flexure 1B includes the first step S1 to the fifth step S5 similar to the first embodiment. The third step S3 to fifth step S5, however, are different from those of the first embodiment.

The third step S3 illustrated in the step (c) of FIG. 8 partly removes the first insulating layer 47 of the first intermediate material 51 of the step (b) to shape the base layer with the aerial base layers 23*a*, 23*b*, and 23*c* and the outrigger base layer 23*d* and thereby form the second intermediate material 53B.

The fourth step S4 illustrated in the step (d) of FIG. 8 covers the second intermediate material 53B of the step (c) i.e. the wiring traces 25*a*, 25*b*, and 25*c*, the aerial base layers 23*a*, 23*b*, and 23*c*, and the outrigger base layer 23*d* with the second insulating layer 55B to form the third intermediate material 57B. The third insulating layer 57B has the link 27Ba including the connecting portion 27Bba in addition to the cover layer for the normal wiring portion and the aerial cover layers 27Ba.

The fifth step S5 illustrated in the step (e) of FIG. 8 partly removes the metal layer 45 of the third intermediate material 57B of the step (d) to shape the metal substrate 5 with the airspace 17 and thereby obtain the product 59B having the aerial cover layer 27Ba that is provided with the link 27Bb i.e. finish the flexure.

According to the second embodiment, the aerial cover layer 27Ba is connected to the outrigger 11 through the link 27Bb, so that positioning accuracy of the wiring traces 25*a*, 25*b*, and 25*c* is improved to more surely prevent the deterioration of the electric characteristic. Further, the interspace between the aerial cover layer 27Ba and the outrigger 11 is connected only by the link 27Bba to allow the rigidity around the tongue to be surely controlled.

Additionally, the second embodiment provides the same effect as the first embodiment.

Figure 9:
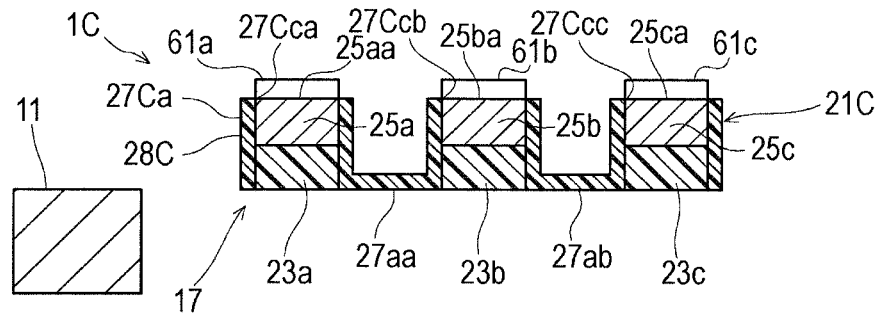
FIG. 9 is a sectional view partly illustrating one aerial wiring portion of a flexure according to a third embodiment of the present invention.
Figure 10:
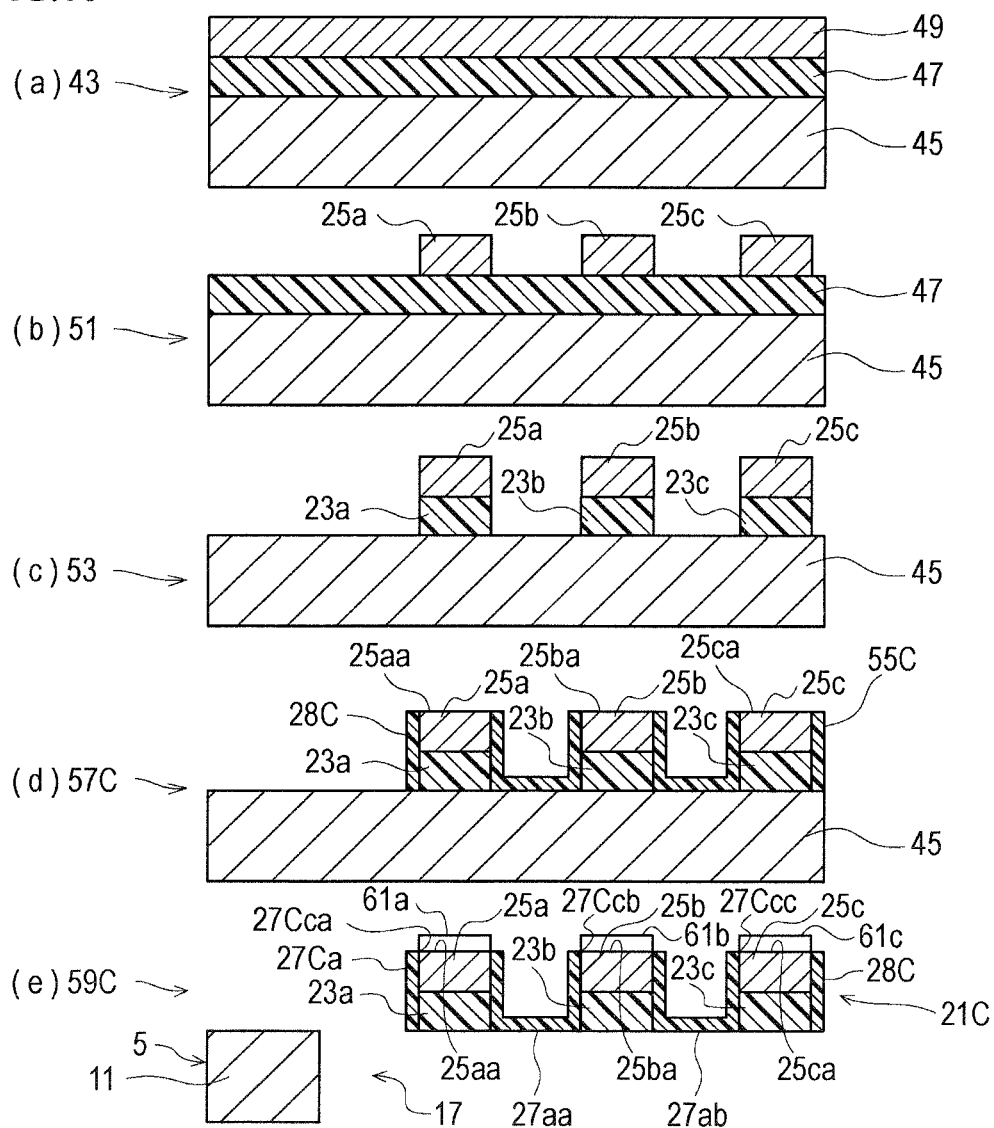
FIG. 10 is a set of sectional views of steps (a)-(e) of a method of manufacturing the flexure according to the third embodiment.

The third embodiment of the present invention will be explained with reference to FIGS. 9 and 10 in which FIG. 9 is a sectional view partly illustrating one aerial wiring portion and FIG. 10 is a set of sectional views of steps (a)-(e) of a method of manufacturing the flexure. The third embodiment is basically the same as the first embodiment, and therefore, parts corresponding to those of the first embodiment are represented with the same reference numerals as the first embodiment, or the same reference numerals plus "C" to omit repetition of explanation.

As illustrated in FIG. 9, the aerial wiring portion 21C according to the third embodiment has openings 27Cca, 27Ccb, and 27Ccc formed through the aerial cover layer 27Ca for the respective wiring traces 25*a*, 25*b*, and 25*c*. The openings 27Cca, 27Ccb, and 27Ccc opens respective top faces of the wiring traces 25*a*, 25*b*, and 25*c* to form top-face-exposed portions 25*aa*, 25*ba*, and 25*ca* on the wiring traces 25*a*, 25*b*, and 25*c*.

The openings 27Cca, 27Ccb, and 27Ccc longitudinally extend along the entire length of the wiring traces 25*a*, 25*b*, and 25*c*. The openings 27Cca, 27Ccb, and 27Ccc, however, may be formed on a plurality of portions along the wiring traces 25*a*, 25*b*, and 25*c* at longitudinal intervals or may be formed on a suitable portion for controlling the rigidity in the routing direction.

The top-face-exposed portions 25*aa*, 25*ba*, and 25*ca* has plated layers 61*a*, 61*b*, and 61*c* to cover the respective wiring traces 25*a*, 25*b*, and 25*c* for corrosion prevention.

As illustrated in FIG. 10, the method of manufacturing flexure 1C includes the first step S1 to the fifth step S5 similar to the first embodiment. The fourth step S4 and the fifth step S5, however, are different from those of the first embodiment.

The fourth step S4 illustrated in the step (d) of FIG. 10 covers the second intermediate material 53C with the second insulating layer 55C while forming the openings 27Cca, 27Ccb, and 27Ccc and the top-face-exposed portions 25*aa*, 25*ba*, and 25*ca* to form the third intermediate material 57C. The second insulating layer 55C is for forming the cover layer with the aerial cover layer 27Ca. The second insulating layer 55C covers or coats both side faces of the wiring traces 25*a*, 25*b*, and 25*c* and the aerial base layers 23*a*, 23*b*, and 23*c* and has connecting portions 27*aa* and 27*ab*. The second insulating layer 55C uncovers the top faces of the wiring traces 25*a*, 25*b*, and 25*c*. With this, the aerial cover layer 27Ca has the openings 27Cca, 27Ccb, and 27Ccc and the top faces of the wiring traces 25*a*, 25*b*, and 25*c* become the top-face-exposed portions 25*aa*, 25*ba*, and 25*ca*.

The fifth step S5 illustrated in the step (e) of FIG. 10 partly removes a metal layer 45 of the third intermediate material 57C to shape the metal substrate 5 with the airspace 17 and forms the plated layers 61*a*, 61*b*, and 61*c* on the top-face-exposed portions 25*aa*, 25*ba*, and 25*ca* to cover the respective wiring traces 25*a*, 25*b*, and 25*c*.

According to the third embodiment, the openings 27Cca, 27Ccb, and 27Ccc are provided to the aerial cover layer 27Ca at the wiring traces 25*a*, 25*b*, and 25*c* so that the aerial cover layer 27Ca is discontinuous in the right and left direction. This reduces the rigidity contribution rate of the aerial wiring portion 21C to allow the rigidity around the tongue to be more easily controlled.

Additionally, the third embodiment provides the same effect as the first embodiment. Further, the structure of the second embodiment regarding the link may be applied to the third embodiment.

Figure 11:
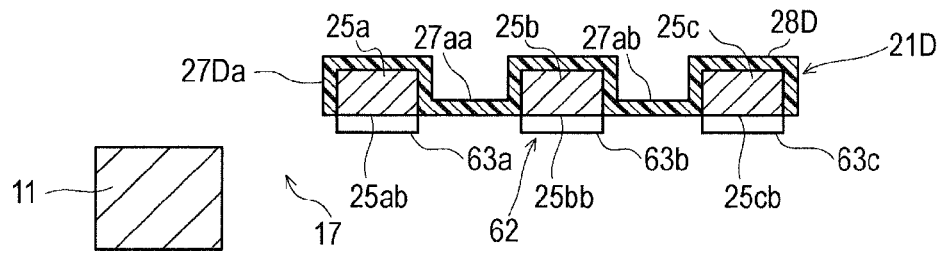
FIG. 11 is a sectional view partly illustrating one aerial wiring portion of a flexure according to a fourth embodiment of the present invention.
Figure 12:
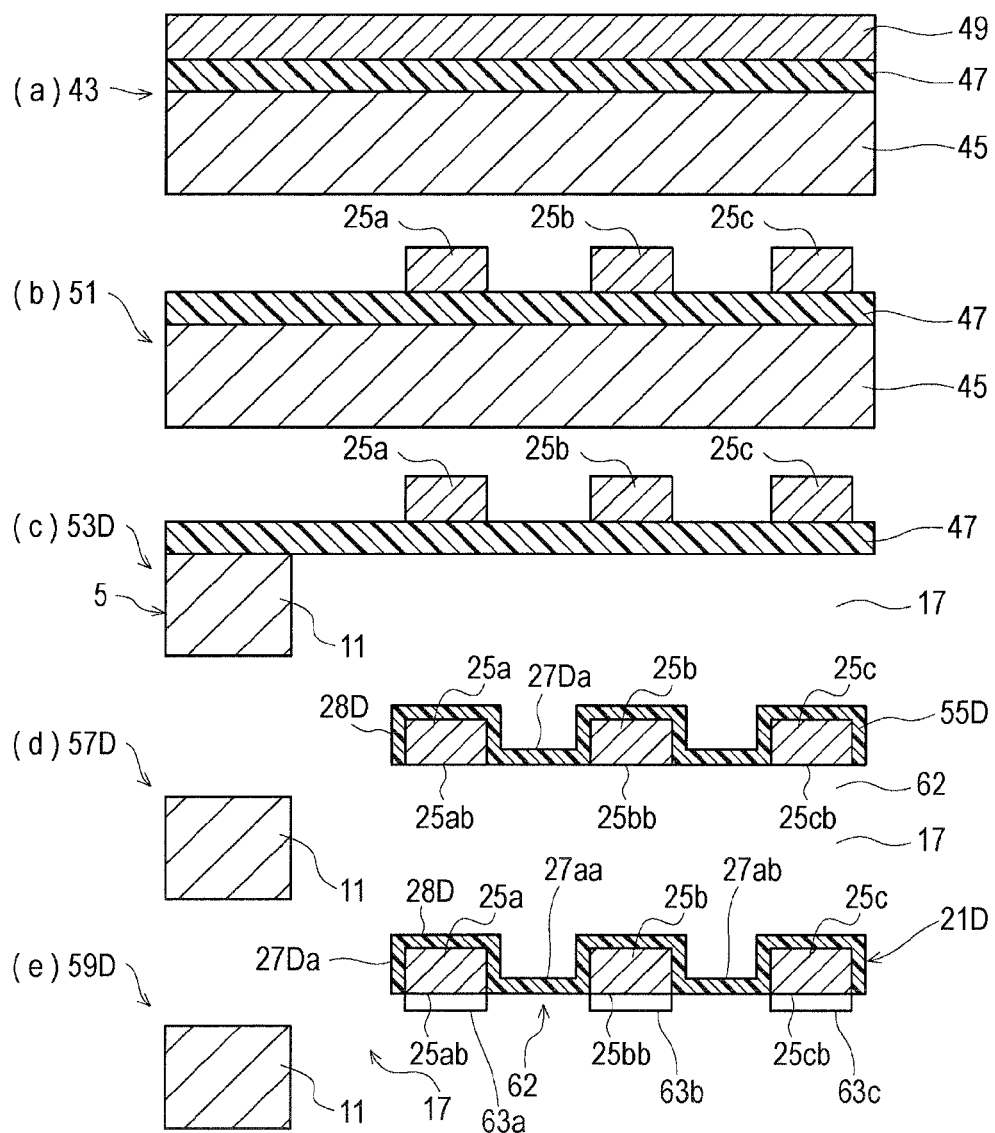
FIG. 12 is a set of sectional views of steps (a)-(e) of a method of manufacturing the flexure according to the fourth embodiment.

The fourth embodiment of the present invention will be explained with reference to FIGS. 11 and 12 in which FIG. 11 is a sectional view partly illustrating one aerial wiring portion and FIG. 12 is a set of sectional views of steps (a)-(e) of a method of manufacturing the flexure. The fourth embodiment is basically the same as the first embodiment, and therefore, parts corresponding to those of the first embodiment are represented with the same reference numerals as the first embodiment, or the same reference numerals plus "D" to omit repetition of explanation.

As illustrated in FIG. 11, the aerial wiring portion 21D according to the fourth embodiment has no aerial base layer. Namely, the base layer defines an extended airspace 62 in the aerial wiring portion 21D. The extended airspace 62 is adjoining to the airspace 17 to form an integrated airspace.

The extended airspace 62 opens back faces of the wiring traces 25*a*, 25*b*, and 25*c* in the aerial wiring portion 21D to form back-face-exposed portions 25*ab*, 25*bb*, and 25*cb* on the respective wiring traces 25*a*, 25*b*, and 25*c*. The back faces of the wiring traces 25*a*, 25*b*, and 25*c* are flash with back faces of the aerial cover layer 27Da.

The back-face-exposed portions 25*ab*, 25*bb*, and 25*cb* extend along the entire length of the wiring traces 25*a*, 25*b*, and 25*c* in the aerial wiring portion 21D. The back-face-exposed portions 25*ab*, 25*bb*, and 25*cb*, however, may be formed on a plurality of portions along the wiring traces 25*a*, 25*b*, and 25*c* at longitudinal intervals or may be formed on a suitable portion relative to the wiring traces 25*a*, 25*b*, and 25*c* for controlling the rigidity. To the back-face-exposed portions 25*ab*, 25*bb*, and 25*cb*, plated layer 63*a*, 63*b*, and 63*c* are provided to cover the wiring traces 25*a*, 25*b*, and 25*c* for corrosion prevention.

As illustrated in FIG. 12, the method of manufacturing flexure 1D includes the first step S1 to the fifth step S5 similar to the first embodiment. The third step S3 to the fifth step S5, however, are different from those of the first embodiment.

The third step S3 illustrated in the step (c) of FIG. 12 partly removes a metal layer 45 of the first intermediate material 51 to shape the metal substrate 5 with the airspace 17 and thereby form the second intermediate material 53D. In the second intermediate material 53D, a portion of the metal layer 45 on the back of the wiring traces 25*a*, 25*b*, and 25*c* is removed to define the airspace 17 and therefore the unfinished outrigger 11 on each side in the right and left direction.

The fourth step S4 illustrated in the step (d) of FIG. 12 covers the second intermediate material 53D of the step (c) with the second insulating layer 55D and partly removes the first insulating layer 47 to form the third intermediate material 57D. In the third intermediate material 57D, the first insulating layer 47 remains in the normal wiring portion and a portion of the first insulating layer 47 in the unfinished aerial wiring portion 21D is removed to define the extended airspace 62.

Further, the second insulating layer 55D of the third intermediate material 57D covers the wiring traces 25*a*, 25*b*, and 25*c* to form the aerial cover layer 27Da so that the back-face-exposed portions 25*ab*, 25*bb*, and 25*cb* are defined on the respective back faces of the wiring traces 25*a*, 25*b*, and 25*c*.

The fifth step S5 illustrated in the step (e) of FIG. 12 forms the plated layers 63*a*, 63*b*, and 63*c* by gold plating etc. to cover the respective back-face-exposed portions 25*ab*, 25*bb*, and 25*cb* of the third intermediate material 57D.

According to the fourth embodiment, there is no aerial base layer on the back of the wiring traces 25*a*, 25*b*, and 25*c* unlike the first embodiment. This reduces the rigidity contribution rate of the aerial wiring portion 21D to allow the rigidity around the tongue to be more easily controlled.

Additionally, the fourth embodiment provides the same effect as the first embodiment. Further, the structure of the second embodiment regarding the link may be applied to the fourth embodiment.

Figure 13A:
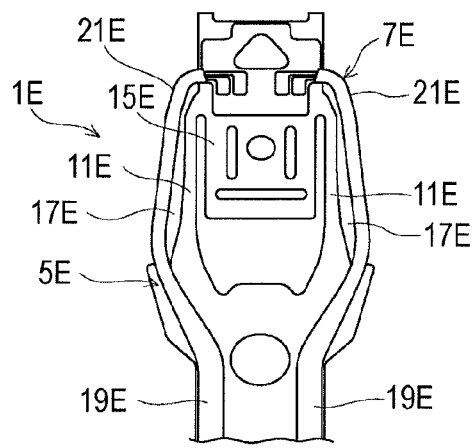
FIG. 13A is a plan view partly illustrating a flexure according to a fifth embodiment of the present invention and FIG. 13B is a back view illustrating the same.
Figure 13B:
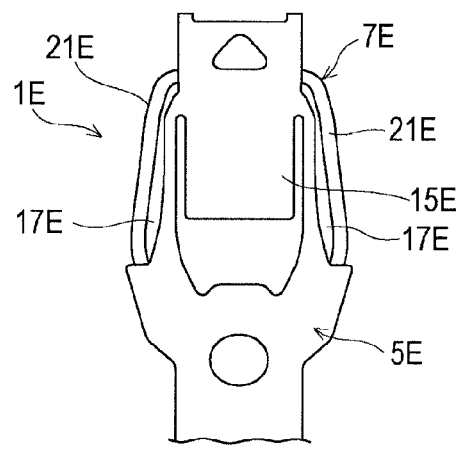

The fifth embodiment of the present invention will be explained with reference to FIGS. 13A and 13B in which FIG. 13A is a plan view partly illustrating a flexure and FIG. 13B is a back view illustrating the same. The fifth embodiment is basically the same as the first embodiment, and therefore, parts corresponding to those of the first embodiment are represented with the same reference numerals as the first embodiment, or the same reference numerals plus "E" to omit repetition of explanation.

The flexure 1E according to the fifth embodiment has the right and left airspaces 17E in which each one airspace is defined on an outer side of the outrigger 11E of the metal substrate 5E in the right and left direction, the outer side being the second side of the outrigger 11E distal to the tongue in the right and left direction. The aerial wiring portion 21E of each side in the right and left direction passes over the airspace 17E.

The outrigger 11E has a planar shape being closer to the tongue 15E than the first embodiment and the airspace 17E is defined in the metal substrate 5E on the outer side of the outrigger 11E.

The wiring part 7E extends from a fixed end of the tongue 15E in the right and left direction so as to pass across the outrigger 11 E. Then, the wiring part 7E on the outer side of the outrigger 11E longitudinally extends toward the rear along the outrigger 11E as the aerial wiring portion 21E passing over the airspace 17E. The aerial wiring portion 21E and the outrigger 11E are arranged side by side.

On a base end or rear end of the outrigger 11E, the aerial wiring portion 21E continues to the normal wiring portion 19E arranged on the metal substrate 5E. The normal wiring portion 19E extends toward the tail portion of the flexure 1E.

According to the fifth embodiment, the aerial wiring portion 21E has any one of the sectional structures of the first to fourth embodiments. This embodiment, therefore, provides the same effect as any one of the first to fourth embodiments.

Figure 14:
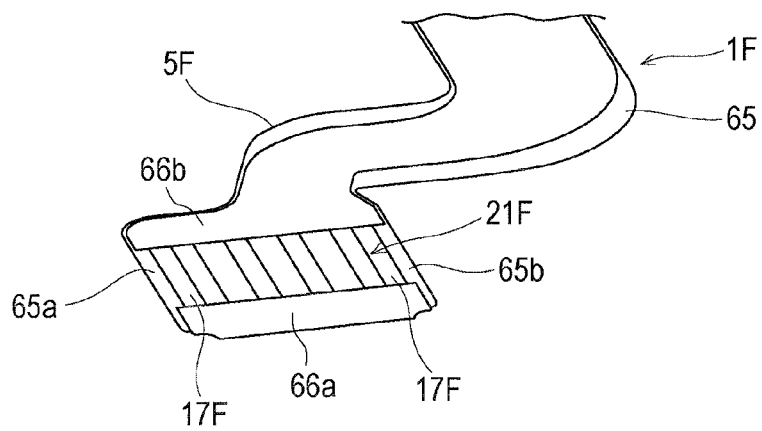
FIG. 14 is a plan view aerial wiring portions and their periphery of a tail portion of a flexure according to a sixth embodiment of the present invention.

The sixth embodiment of the present invention will be explained with reference to FIG. 14 that is a plan view aerial wiring portions and its periphery of a tail portion of a flexure.

According to the sixth embodiment, the normal wiring portion 19F extends to the tail portion 65 of the flexure IF and the tail portion 65 has the aerial wiring portions 21F. The tail portion 65 includes first and second parts 66a and 66b and bridge portions 65a and 65b as well as the aerial wiring portions 21F. The first and second parts 66a and 66b are connected together through the bridge portions 65a and 65b arranged on respective lateral sides of the tail portion 65. Between the bridge portions 65a and 65b, the airspace 17 is defined. The aerial wiring portions 21F longitudinally pass across the airspace 17 so as to be parallel with each other and the bridge portions 65a and 65b.

Each one aerial wiring portion 21F has any one of the sectional structures of the first to fourth embodiments. The sixth embodiment, therefore, provides the same effect as any one of the first to fourth embodiments in the tail portion 65 such that the sixth embodiment controls the rigidity of the tail portion 65 and prevents the deterioration of the electric characteristic of the tail portion 65.

What is claimed is:

1. A wiring thin plate comprising:
 a supporting layer made of metal;
 an insulating base layer provided on a top face of the supporting layer;
 a wiring part having a plurality of wiring traces provided on a top face of the base layer;
 an insulating cover layer covering the wiring traces;
 an airspace defined by the supporting layer;
 an aerial wiring portion that is a part of the wiring part passing over the airspace;
 aerial base layers provided to the base layer at the respective wiring traces in the aerial wiring portion and being apart from each other; and
 an aerial cover layer provided to the insulating cover layer in the aerial wiring portion and spanning from the wiring traces of the aerial wiring portion through the aerial base layers and through interspaces between adjacent aerial base layers of said aerial base layers to bridge the interspaces between the adjacent aerial base layers.

2. The wiring thin plate according to claim 1, wherein each one aerial base layer of said aerial base layers has a same width as a corresponding wiring trace formed on said each one aerial base layer.

3. The wiring thin plate according to claim 1, further comprising:
 a link provided to the aerial cover layer so that the link extends to the supporting layer in a direction along which the wiring traces are arranged side by side.

4. A flexure using the wiring thin plate according to claim 1, further comprising:
 outriggers provided to the supporting layer, and
 a tongue supported with the outriggers and on which a slider is attached,
 wherein the airspace is defined on one of first and second sides of each one outrigger of said outriggers, the first side being proximal to the tongue and the second side being distal to the tongue.

5. A method of manufacturing the wiring thin plate according to claim 1, comprising:
 laminating a metal layer as the supporting layer, a first insulating layer as the base layer, and a conductive layer as the wiring part in this order to form a base material;
 partly removing the conductive layer of the base material to shape the wiring part and form a first intermediate material;
 partly removing the first insulating layer of the first intermediate material to shape the base layer with the aerial base layers and form a second intermediate material;
 covering the wiring part and the aerial base layers of the second intermediate material with a second insulating layer for the aerial cover layer to form a third intermediate material; and
 partly removing the metal layer of the third intermediate material to shape the supporting layer with the airspace and finish the wiring thin plate.

6. A wiring thin plate comprising:
 a supporting layer made of metal;
 an insulating base layer provided on a top face of the supporting layer,
 a wiring part having a plurality of wiring traces provided on a top face of the base layer;
 an insulating cover layer covering the wiring traces;
 an airspace defined by the supporting layer;
 an aerial wiring portion that is a part of the wiring part passing over the airspace;
 aerial base layers provided to the base layer at the respective wiring traces in the aerial wiring portion and being apart from each other;
 an aerial cover layer provided to the insulating cover layer in the aerial wiring portion and spanning from the wiring traces of the aerial wiring portion through the aerial base layers and through interspaces between adjacent aerial base layers of said aerial base layers to bridge the interspaces between the adjacent aerial base layers;
 openings formed through the aerial cover layer to open respective top faces of the wiring traces of the aerial wiring portion, thereby to form top-face-exposed portions on the respective wiring traces of the aerial wiring portion; and plated layers covering the respective wiring traces in the top-face-exposed portions.

7. A method of manufacturing the wiring thin plate according to claim 6, comprising:
laminating a metal layer as the supporting layer, a first insulating layer as the base layer, and a conductive layer as the wiring part in this order to form a base material;
partly removing the conductive layer of the base material to shape the wiring part and form a first intermediate material;
partly removing the first insulating layer of the first intermediate material to shape the base layer with the aerial base layers and form a second intermediate material;
covering the wiring part and the aerial base layers of the second intermediate material with a second insulating layer for the aerial cover layer and forming the openings to shape the top-face-exposed portions and form a third intermediate material; and
partly removing the metal layer of the third intermediate material to shape the supporting layer with the airspace and forming the plated layers on the top-face-exposed portions to cover the respective wiring traces and finish the wiring thin plate.

8. The wiring thin plate according to claim 6,
wherein each one aerial base layer of said aerial base layers has a same width as a corresponding wiring trace formed on said each one aerial base layer.

9. The wiring thin plate according to claim 6, further comprising:
a link provided to the aerial cover layer so that the link extends to the supporting layer in a direction along which the wiring traces are arranged side by side.

10. A wiring thin plate comprising:
a supporting layer made of metal;
an insulating base layer provided on a top face of the supporting layer;
a wiring part having a plurality of wiring traces provided on a top face of the base layer;
an insulating cover layer covering the wiring traces;
an airspace defined by the supporting layer;
an aerial wiring portion that is a part of the wiring part passing over the airspace;
an extended airspace defined by the base layer in the aerial wiring portion to open back faces of the wiring traces in the aerial wiring portion, thereby to form on the respective wiring traces of the aerial wiring portion back-face-exposed portions facing the airspace;
an aerial cover layer provided to the insulating cover layer in the aerial wiring portion and spanning from the wiring traces of the aerial wiring portion through interspaces between adjacent wiring traces of said wiring traces of the aerial wiring portion to bridge the interspaces between the adjacent aerial base layers; and
plated layers covering the respective wiring traces in the back-face-exposed portions.

11. The wiring thin plate according to claim 10,
wherein the aerial cover layer joins the adjacent wiring traces of the aerial wiring portion together.

12. A method of manufacturing the wiring thin plate according to claim 10, comprising:
laminating a metal layer as the supporting layer, a first insulating layer as the base layer, and a conductive layer as the wiring part in this order to form a base material;
partly removing the conductive layer of the base material to shape the wiring part and form a first intermediate material;
partly removing the metal layer of the first intermediate material to shape the supporting layer with the airspace and form a second intermediate material;
covering the wiring part of the second intermediate material with a second insulating layer for the aerial cover layer and partly removing the first insulating layer of the second intermediate material to shape the base layer, the extended airspace and the back-face-exposed portions and form a third intermediate material; and
forming the plated layers on the respective back-face-exposed portions of the third intermediate material to cover the wiring traces and finish the wiring thin plate.

13. The wiring thin plate according to claim 10,
wherein each one aerial base layer of said aerial base layers has a same width as a corresponding wiring trace formed on said each one aerial base layer.

14. The wiring thin plate according to claim 10, further comprising:
a link provided to the aerial cover layer so that the link extends to the supporting layer in a direction along which the wiring traces are arranged side by side.

* * * * *